US011520658B2

(12) United States Patent
Irby et al.

(10) Patent No.: US 11,520,658 B2
(45) Date of Patent: Dec. 6, 2022

(54) NON-VOLATILE MEMORY ON CHIP

(71) Applicant: Arm Limited, Cambridge (GB)

(72) Inventors: Joel Thornton Irby, Austin, TX (US); Wendy Arnott Elsasser, Austin, TX (US); Mudit Bhargava, Austin, TX (US); Yew Keong Chong, Austin, TX (US); George McNeil Lattimore, Austin, TX (US); James Dennis Dodrill, Dripping Springs, TX (US)

(73) Assignee: Arm Limited, Cambridge (GB)

( * ) Notice: Subject to any disclaimer, the term of this patent is extended or adjusted under 35 U.S.C. 154(b) by 511 days.

(21) Appl. No.: 16/669,906

(22) Filed: Oct. 31, 2019

(65) Prior Publication Data

US 2021/0133027 A1 May 6, 2021

(51) Int. Cl.
*G06F 11/10* (2006.01)
*G11C 5/14* (2006.01)
*G11C 7/10* (2006.01)
*G11C 29/12* (2006.01)
*G06N 20/00* (2019.01)

(52) U.S. Cl.
CPC ......... *G06F 11/1076* (2013.01); *G06N 20/00* (2019.01); *G11C 5/14* (2013.01); *G11C 7/1006* (2013.01); *G11C 7/1069* (2013.01); *G11C 7/1096* (2013.01); *G11C 29/12* (2013.01)

(58) Field of Classification Search
CPC ....... G06F 11/1076; G06N 20/00; G11C 5/14; G11C 7/1006; G11C 7/1069; G11C 7/1096; G11C 29/12; G11C 29/028; G11C 2029/3202; G11C 2207/2254; G11C 29/32; G11C 29/42; G11C 29/44; G11C 11/54

See application file for complete search history.

(56) References Cited

U.S. PATENT DOCUMENTS 6,032,109 A 2/2000 Ritmiller, III
9,767,924 B1 9/2017 Bhargava et al.
(Continued)

FOREIGN PATENT DOCUMENTS

WO 99/54839 10/1999

OTHER PUBLICATIONS

Partial International Search Report for PCT/GB2020/052366 dated Jan. 14, 2021, 13 pages.
(Continued)

*Primary Examiner* — Ajay Ojha
(74) *Attorney, Agent, or Firm* — Nixon & Vanderhye P.C.

(57) ABSTRACT

A system-on-chip is provided that includes functional circuitry that performs a function. Control circuitry controls the function based one or more configuration parameters. Non-volatile storage circuitry includes a plurality of non-volatile storage cells each being adapted to write at least a bit of the one or more configuration parameters in a rewritable, persistent manner a plurality of times. Read circuitry locally accesses the non-volatile storage circuitry, obtains the one or more configuration parameters from the non-volatile storage circuitry and provides the one or more configuration parameters to the control circuitry. Write circuitry obtains the one or more configuration parameters and provides the one or more configuration parameters to the non-volatile storage circuitry by locally accessing the non-volatile storage circuitry.

18 Claims, 12 Drawing Sheets

(56) References Cited

U.S. PATENT DOCUMENTS

2014/0075087 A1    3/2014   Battling et al.
2016/0246672 A1*   8/2016   Yang ...................... G06F 3/064
2019/0340060 A1*  11/2019   Nijhawan ........... G06F 11/0754

OTHER PUBLICATIONS

International Search Report and Written Opinion of the International Searching Authority for PCT/GB2020/052366 dated Mar. 9, 2021, 18 pages.

\* cited by examiner

NON-VOLATILE MEMORY ON CHIP

TECHNICAL FIELD

The present disclosure relates to data processing. More particularly, it relates to non-volatile memory.

DESCRIPTION

A system-on-chip may encapsulate a number of circuits used to provide a processing apparatus such as a memory and execution units. Typically, however, a system-on-chip is designed to run at a low power, which makes persistent storage of data problematic.

SUMMARY

Viewed from a first example configuration, there is provided a system-on-chip, comprising: functional circuitry to perform a function; control circuitry to control the function based one or more configuration parameters; non-volatile storage circuitry comprising a plurality of non-volatile storage cells each being adapted to write at least a bit of the one or more configuration parameters in a rewritable, persistent manner a plurality of times; read circuitry to locally access the non-volatile storage circuitry, obtain the one or more configuration parameters from the non-volatile storage circuitry and provide the one or more configuration parameters to the control circuitry; and write circuitry to obtain the one or more configuration parameters and provide the one or more configuration parameters to the non-volatile storage circuitry by locally accessing the non-volatile storage circuitry.

Viewed from a second example configuration, there is provided a data processing method, comprising: performing a function using functional circuitry; controlling the function based one or more configuration parameters; and locally accessing non-volatile storage circuitry comprising a plurality of non-volatile storage cells each being adapted to write at least a bit of the one or more configuration parameters in a rewritable, persistent manner a plurality of times in order to obtain the one or more configuration parameters from the non-volatile storage circuitry to be used in the step of controlling, and/or provide the one or more configuration parameters to the non-volatile storage circuitry to be stored, wherein the functional circuitry and the non-volatile storage circuitry are part of a same system-on-chip.

Viewed from a third example configuration, there is provided a system-on-chip, comprising: functional circuitry to perform a function based one or more configuration parameters; error detection circuitry to detect errors during the function and to generate data relating to the errors; non-volatile storage circuitry comprising a plurality of non-volatile storage cells each being adapted to write at least a bit of the one or more configuration parameters in a rewritable, persistent manner a plurality of times; and write circuitry to locally access the non-volatile storage circuitry and provide the data to the non-volatile storage circuitry.

BRIEF DESCRIPTION OF THE DRAWINGS

The present invention will be described further, by way of example only, with reference to embodiments thereof as illustrated in the accompanying drawings, in which.

DESCRIPTION OF EXAMPLE EMBODIMENTS

Figure 1:
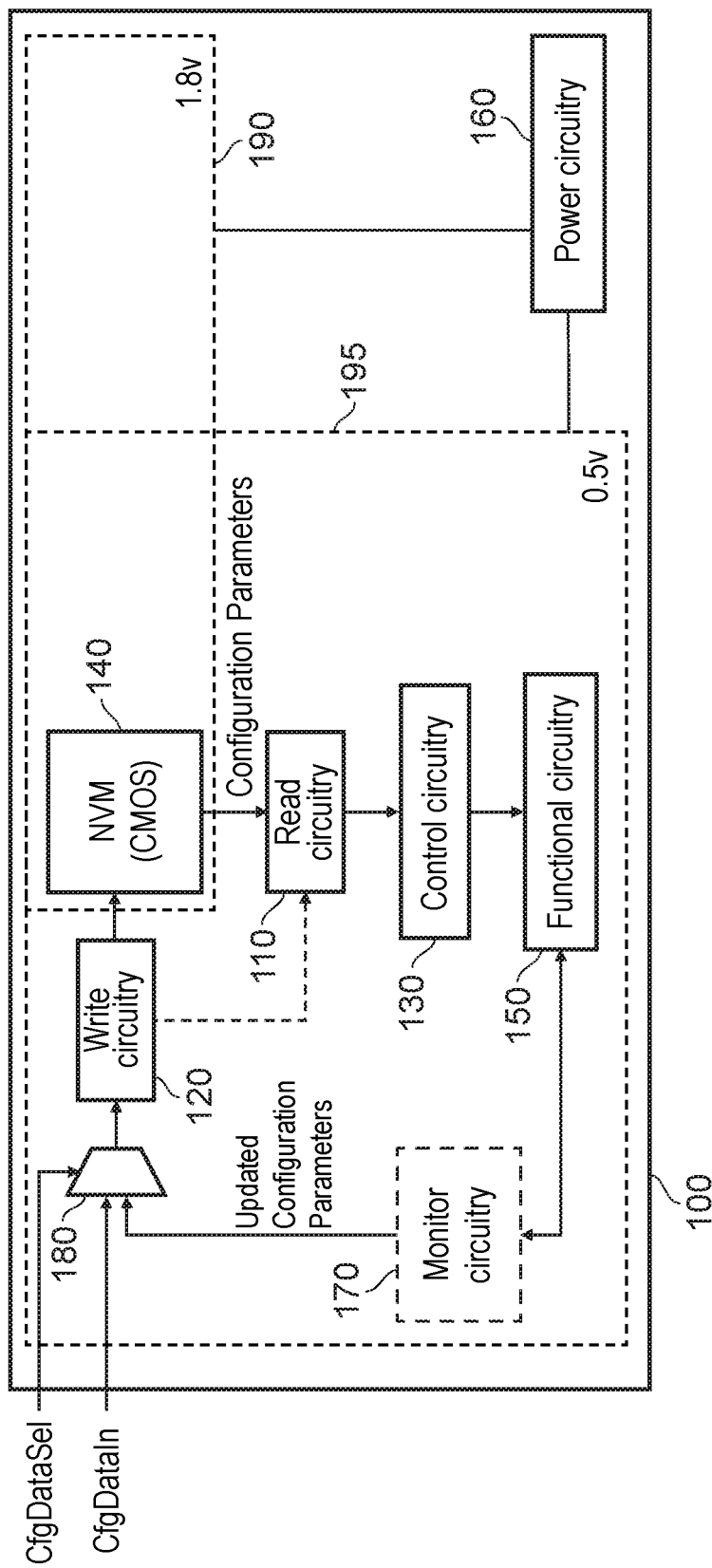
FIG. 1 illustrates a system-on-chip in accordance with some examples.

Before discussing the embodiments with reference to the accompanying figures, the following description of embodiments is provided.

In accordance with one aspect there is provided a system-on-chip, comprising: functional circuitry to perform a function; control circuitry to control the function based one or more configuration parameters; non-volatile storage circuitry comprising a plurality of non-volatile storage cells each being adapted to write at least a bit of the one or more configuration parameters in a rewritable, persistent manner a plurality of times; read circuitry to locally access the non-volatile storage circuitry, obtain the one or more configuration parameters from the non-volatile storage circuitry and provide the one or more configuration parameters to the control circuitry; and write circuitry to obtain the one or more configuration parameters and provide the one or more configuration parameters to the non-volatile storage circuitry by locally accessing the non-volatile storage circuitry.

A system-on-chip (SoC) typically provides circuits or logic corresponding with a computer system (e.g. a CPU and memory) on a substrate or microchip. The substrate could be a so-called 2.5D substrate in which modules are assembled side-by-side on a single plane to form a single chip, or even a 3D substrate in which modules can be assembled in three dimensions to form a single chip. Of course a mixture of these techniques (heterogeneous integration) can also be used. A goal of such a microchip may be provide computational capabilities using low power. Limited power requirements can make it very difficult to provide data storage capabilities. The above embodiments store data on an SoC by using locally provided non-volatile storage cells.

Such embodiments are thereby able to store configuration parameters in a rewriteable, persistent manner. For instance, not only can the configuration parameters be changed and revised parameters provided (written or updated) back to the non-volatile storage cells, but the configuration parameters are not lost as a consequence of power loss. This allows the storage fine-grained configuration parameters, faster and lower-energy power up and dynamic adjustment of configuration parameters "in the field" and this in turn can be used to provide power/performance tradeoffs, energy reduction from more extensive power-off mechanisms, and improvement in operating characteristics. Furthermore, since the non-volatile storage is provided on-chip, it is possible to avoid the use of serial shift registers and the like, in order to import the data on to the chip. The non-volatile storage circuitry can include, for instance, embedded MRAM (eMRAM), RRAM, PCM, FeFET, FeRAM, and CeRAM. A further advantage to storing the configuration parameters on-chip (on-die) is to improve security. In particular, it becomes very difficult to forcibly access data stored on the system-on-chip since the data is not exposed on an I/O bus where it can be stolen and/or altered.

In some embodiments, the system-on-chip comprises power circuitry to provide at least one voltage domain to the functional circuitry and the non-volatile storage circuitry. A voltage domain can be considered to be an area of a system-on-chip whose voltage supply can be independently controlled as compared to other areas of the system-on-chip. Such control could be provided as a consequence of the different areas of the chip having different voltages supplies or could be provided as a consequence of the different areas having a single voltage supply with the areas being separated by voltage gates. In these embodiments, the functional circuitry and the non-volatile storage circuitry may share one or more voltage domains.

In some embodiments, the voltage domain has a voltage of 1.8 volts or less. As a consequence of the voltage domain having a voltage of 1.8 volts or less, only certain forms of non-volatile storage circuitry can be used. In particular, those forms of non-volatile storage necessitating a voltage of greater than 1.8 volts cannot be used.

In some embodiments, the non-volatile storage circuitry is CMOS compatible. Complementary Metal Oxide Semiconductor (CMOS) is a fabrication process used for the production of particular types of logic gate. Such techniques are distinguished from p-type metal-oxide-semiconductor logic (PMOS) and n-type metal-oxide-semiconductor logic (NMOS) fabrication techniques, which are combined in order to provide the CMOS technique. CMOS fabrication techniques can be used in order to provide high noise immunity and low static power consumption.

In some embodiments, the functional circuitry is an analog/mixed-signal circuit; and the one or more configuration parameters comprise one or more trim settings. Trim settings may include, for example, bias currents or gain settings of transistors that may be set in order to account for variations in process, voltage, and or temperature. It may be necessary in order to determine such trim settings on a device-by-device basis, which may be determined after manufacturing. In practice, it may be necessary to determine appropriate trim settings by testing, which may consume time and energy. Consequently, by including the trim settings as part of the configuration parameters that are stored on the non-volatile storage circuitry, it may be possible to avoid the need for such testing to be performed each time the system-on-chip is activated. This in turn can lead to improvements in energy efficiency.

In some embodiments, the functional circuitry comprises a plurality of resistors, each of the resistors being coupled with a switch in series and each resistor, switch pair being arranged in parallel; and the one or more configuration parameters control which of the switches is open or closed. By controlling the number and combination of switches that are open and closed, it is possible to control the number and types of resistors that are coupled in parallel. As a consequence of this, it is possible to dynamically control the resistance based on the configuration parameters.

In some embodiments, the functional circuitry comprises one or more transistors; and the one or more configuration parameters control a gain of the one or more transistors.

In some embodiments, the functional circuitry has a plurality of operating modes, each of the operating modes corresponding with a voltage and a frequency with which the functional circuitry can be made to operate; and the one or more configuration parameters indicate which of the operating modes should be used based on at least one of: temperature, workload, and current operation to be performed by the functional circuitry. By scaling the frequency and the voltage supplied to a clock of a microprocessor, it is possible to control the amount of energy consumed. In particular, the power consumption of a processor is influenced by the square of the voltage supplied. The voltage also affects the maximum frequency at which the processor can operate. Consequently, if both the frequency and voltage are lowered, it is possible to make a significant saving in terms of power consumption, at the cost of processing speed. Furthermore as the temperature increases (which will also occur when operating at higher speeds) the efficacy of the circuitry, as well as its lifetime, will decrease. These facts can therefore lead to the introduction of a number of operating modes, with each of the modes specifying a voltage and frequency at which the functional circuitry operates. Through testing, it is possible to determine the appropriate operating mode to use in view of a current temperature, workload, and/or operation of the processor. Clearly it would be undesirable for such information to be lost each time the system-on-chip is reset. By performing such testing of the specific circuitry once after manufacture, and by saving the result of the testing, it is possible to make use of such information repeatedly without necessitating the rerunning of tests.

In some embodiments, the functional circuitry is adapted, in response to an event, to run a performance test to determine which of the operating modes should be used for each of the at least one of temperature, workload, and current operation to be performed by the functional circuitry; and the write circuitry is adapted to write results of the performance test as the one or more configuration parameters. The performance test may therefore be run in response to an event occurring. Having run the performance test, the results of that test or tests can be written as one or more of the configuration parameters such that the performance test data can be accessed again at a later time.

In some embodiments, the event is the expiration of a period of time. It is possible for the nature of the circuitry to change over time. For instance, excessive use of particular circuits may cause those circuits to deteriorate. Consequently, it may be appropriate to rerun the performance test either after the circuitry has had an opportunity to "burn in" or every period of time in order to determine whether any of the circuitry has deteriorated since the last test was run. In this way, the determination of the post appropriate operating mode may change according to newly available data.

In some embodiments, the plurality of modes comprises a low power mode of operation; the one or more configuration parameters comprise a current state of the functional circuitry; and the functional circuitry is adapted to use the write circuitry when entering the low power mode of operation and to use the read circuitry when exiting the low power mode of operation. The current state of the functional circuitry may represent a current operating state. For instance, the current operating state of the functional circuitry may include content such as temporary values that are stored during its operation. In these embodiments, the current state of the functional circuitry is saved using the write circuitry when the functional circuitry or system-on-chip enters a low power mode of operation. As a consequence of this, temporary variables that are used during the operation can be maintained and restored using the read circuitry when exiting the low power mode of operation. This makes it possible to "duty cycle" the system-on-chip since the system is able to rapidly save a current state of the functional circuitry as well as restore the operation of the functional circuitry more quickly circuitry (by virtue of the fast on-chip non-volatile storage circuitry). It is therefore possible to enter a low power mode of operation more frequently than would otherwise be possible. This in turn leads to energy savings.

In some embodiments, the one or more configuration parameters comprise a current state of the functional circuitry; and the current state of the functional circuitry comprises at least one of: temperature, workload, and clock frequency of the functional circuitry. In this way it is possible to create a historical record of the state of the functional circuitry. By keeping the data on the system-on-chip (e.g. so that the data need not be accessed via an I/O bus), the data can be kept more secure and can be protected from unauthorised modification. This makes it practical to warn the user when a component needs to be serviced, and also to provide a service provider with information regarding the way in which the system has been used to help diagnose problems and to provide service and service guarantees.

In some embodiments, the functional circuitry comprises error detection circuitry to detect errors during the function and to write data relating to at least some of the errors. By making note of errors that occur during the function, it is possible to take corrective or evasive action in the future. By storing this data to non-volatile storage circuitry, such errors can be tracked across resets of the system-on-chip such that such information is not lost when the system-on-chip is powered down. In this way, it is possible to keep a longer record of detected errors, which can therefore be used in order to influence the behaviour of the functional circuitry.

In some embodiments, the one or more configuration parameters comprise control of a type and a frequency of those of the errors that form the at least some of the errors.

In some embodiments, the functional circuitry comprises Error Correcting Code circuitry comprising a plurality of memory cells. Error Correcting Code circuitry may be used in combination with memory cells in order to detect and or correct one or more errors in bits stored in memory cells. This can be achieved by techniques such as check sum or cyclic redundancy codes. Depending on the nature of the technique used, one or more bit errors may be detected and one or more bit errors (typically one fewer than the number that can be detected) can be corrected. Such Error Correcting Code circuitry may be used in order to detect errors during the function performed by the functional circuitry.

In some embodiments, in response to the error detection circuitry detecting an error with one of the memory cells in the Error Correcting Code circuitry, the one or more configuration parameters are adapted to indicate the one of the memory cells as a faulty memory cell; and the control circuitry is adapted to inhibit use of either: the faulty memory cell, or a plurality of the memory cells comprising the faulty memory cell. As a consequence of detecting an error with one of the memory cells using the error correcting code circuitry, it is possible to take note of the memory cell. Such information can be maintained, e.g., even when the system-on-chip is powered down. Consequently, knowledge of a potentially faulty memory cell need not be lost. With this information being known, it is possible to inhibit use of that memory cell or alternatively a group of memory cells containing that memory cell depending on the degree to which control over the use of memory cells is possible in the hardware, thereby increasing the overall reliability of the memory. Of course, it is possible to regenerate the faulty memory cell map (i.e., location of one or more bitcells that are faulty) by running a test using circuitry like BIST (built-in-self-test). However, some errors are stochastic, and are sometimes dependent on the operating conditions during the test (e.g., frequency, temperature, voltage drop, etc.) because of which some errors may not be caught during such a test. Therefore, any error caught during regular operations or during one of the BIST tests, when recorded in an NVM, is much more desirable—as it covers a wider range of conditions in which errors are caught.

In some embodiments, the functional circuitry comprises an array of sensors; in response to the error detecting circuitry detecting an error with one of the sensors, the one or more configuration parameters are adapted to indicate the one of the sensors as a faulty sensor; and the control circuitry is adapted to inhibit use of either: the faulty sensor, or a plurality of sensors comprising the faulty sensor. Where the error detecting circuitry detects an error with one of the sensors, it is possible to update the configuration parameters so that the note of the faulty sensor is recorded and can be maintained even when the system-on-chip is powered down. With this information, it is possible to avoid use of the faulty sensor in the future or to avoid use of a plurality of sensors containing that faulty sensor.

In some embodiments, the functional circuitry comprises processing circuitry adapted to perform a machine learning process; the one or more configuration parameters comprise a set of weights; and the processing circuitry is adapted to devise the weights based on training data and to cause the write circuitry to write the weights to the non-volatile storage circuitry. Machine learning processes could include training and/or inference operations used on a set of input data for performing computations such as an analysis. For example, machine learning processes could be used for so called optimisation tasks where an extremely large number of possibilities exist and where there is no known algorithm or no efficient algorithm in order to truly optimise the result. One example of this is the travelling salesman problem. The training used from a machine learning process can take an extensive period of time and it is undesirable for the training to be repeated each time the system is to be used. Consequently, by devising a set of weights used to influence particular parameters that are determined based on the training data and by saving those weights to the non-volatile storage circuitry using the right circuitry, it is possible to actually make use of the trained machine learning process, after the system-on-chip is powered down.

In some embodiments, the processing circuitry is adapted to perform the machine learning process on the weights using live data to produce a set of updated weights; and the processing circuitry is adapted to cause the write circuitry to write the updated weights to the non-volatile storage circuitry. Even when an initial training process has been completed, it is possible to use live data on an ongoing basis in order to update the weights that were initially determined. This makes it possible to improve the system over time based on real live data as opposed to training data, which may be artificial, out of date, or not specific to the environment in which the system-on-chip is deployed.

In accordance with another aspect, there is provided a system-on-chip, comprising: functional circuitry to perform a function based one or more configuration parameters; error detection circuitry to detect errors during the function and to generate data relating to the errors; non-volatile storage circuitry comprising a plurality of non-volatile storage cells each being adapted to write at least a bit of the one or more configuration parameters in a rewritable, persistent manner a plurality of times; and write circuitry to locally access the non-volatile storage circuitry and provide the data to the non-volatile storage circuitry.

Such aspects may use the above-described system-on-chip to provide a mechanism in which not only configuration parameters used during the operation of the functional circuitry, but also data relating to errors that occur during the operation of the functional circuitry are stored. As stated above, this allows the storage fine-grained configuration parameters, faster and lower-energy power up and dynamic adjustment of configuration parameters "in the field" as well as the ability to store data relating to errors persistently (e.g. even after being powered off or losing power) and at low energy cost. Furthermore, the data can be stored securely by not exposing it to the I/O bus from where the data could be accessed and/or modified.

Particular embodiments will now be described with reference to the figures.

FIG. 1 illustrates a system-on-chip 100 in accordance with some examples. The system-on-chip 100 includes non-volatile storage circuitry 140, which is CMOS compatible. The non-volatile storage circuitry 140 stores configuration parameters that can be read by read circuitry 110 and passed to control circuitry 130, which uses the parameters to control functional circuitry 150. The functional circuitry 150 could be a processor or sensor for instance. In general the functional circuitry 150 is circuitry that is capable of generating or processing data and can perform the generating or processing of the data in a variety of ways, with the selected way being selected as a consequence of the configuration parameters that are provided. In response, the functional circuitry 150 may update the configuration parameters and/or generate data, which is passed back to the write circuitry 120, which stores the configuration parameters and/or data back into the non-volatile storage circuitry 140. The non-volatile storage circuitry 140 and the functional circuitry 150 both form part of the system-on-chip 100, e.g. are local to one another. As a consequence of this, communication between these two circuits can be made particularly efficient. Furthermore, since the non-volatile memory is rewriteable, it is possible for the configuration parameters to be updated over time.

The system-on-chip 100 also includes power circuitry 160, which provides power to the different circuits on the chip 100. The power circuitry 160 provides two power domains 190, 195. Components within one of the power domains 190 can operate at a given voltage independently of components outside that power domain 190. In these examples, a 1.8 v power domain 195 is provided, which includes the non-voltage storage circuitry 140. A 0.5 v power domain 190 is also provided, which includes the read circuitry 110, the write circuitry 120, the control circuitry 130, the non-volatile storage circuitry 140, and the functional circuitry 150. Consequently, the non-volatile storage circuitry 140 can operate at 1.8 v independently of the read circuitry 110, write circuitry 120, and the control circuitry, which operate at 0.5 v. The non-volatile storage circuitry 140 can also operate at 0.5 v if desired (although this may limit its functionality). In these examples, therefore, the voltage domains 190, 195 provided by the power circuitry 160 do not exceed 1.8 v and so the system-on-chip 100, including the non-volatile storage circuitry 140, can also operate at or below 1.8 v.

In this example, the system-on-chip 100 also includes monitor circuitry 170. In this example, the monitor circuitry 170 is responsible for monitoring the behaviour of the functional circuitry 150 in order to generate updated configuration parameters as required. The generation of the updated configuration parameters is therefore not performed directly by the functional circuitry 150 in this embodiment. Furthermore, additional parameters may be considered when generating the updated parameters. A 2:1 multiplexer 180 is also provided in order to multiplex between configuration data, which may be received off-chip (CfgDataIn) and configuration parameters received by the read circuitry, as potentially modified by the monitor circuitry. A selection signal CfgDataSel is provided to select between these two sources of the configuration data. When the configuration parameters are updated, this may signal the write circuitry 120 to write the updated parameters back to the non-volatile memory 140.

The configuration data may be provided once on install/manufacture (in the form of CfgDataIn), where it is written to the non-volatile memory 140 by the write circuitry 120. Thereafter, the configuration data may be accessed via the non-volatile memory 140.

In some embodiments, the monitor circuitry 170 could be used to control the functional circuitry 150 in a test-mode in order to test the viability of new parameters. For example, the monitor circuitry 170 may perform a series of tests in order to establish the performance of the functional circuitry 150 (e.g. a processor) at different frequency/voltage combinations. Such a test could be carried out at different temperatures and the results could be stored in the non-volatile storage circuitry 140 as configuration parameters. In the future, in response to a particular processor load and/or temperature change, an appropriate voltage/frequency combination could be selected in order to provide an efficient combination based on the current processor load. Due to the locality of the non-volatile storage circuitry 140, it is possible to not only provide a wide array of different frequency/voltage combinations, but also to have these persist across resets of the system-on-chip 100. Furthermore, since the non-volatile storage circuitry 140 can be accessed quickly, due to being locally placed, the frequency/voltage of the functional circuitry (or its other operating parameters) can be adjusted more quickly thereby making it more efficient to scale the operating parameters frequently.

Figure 2:
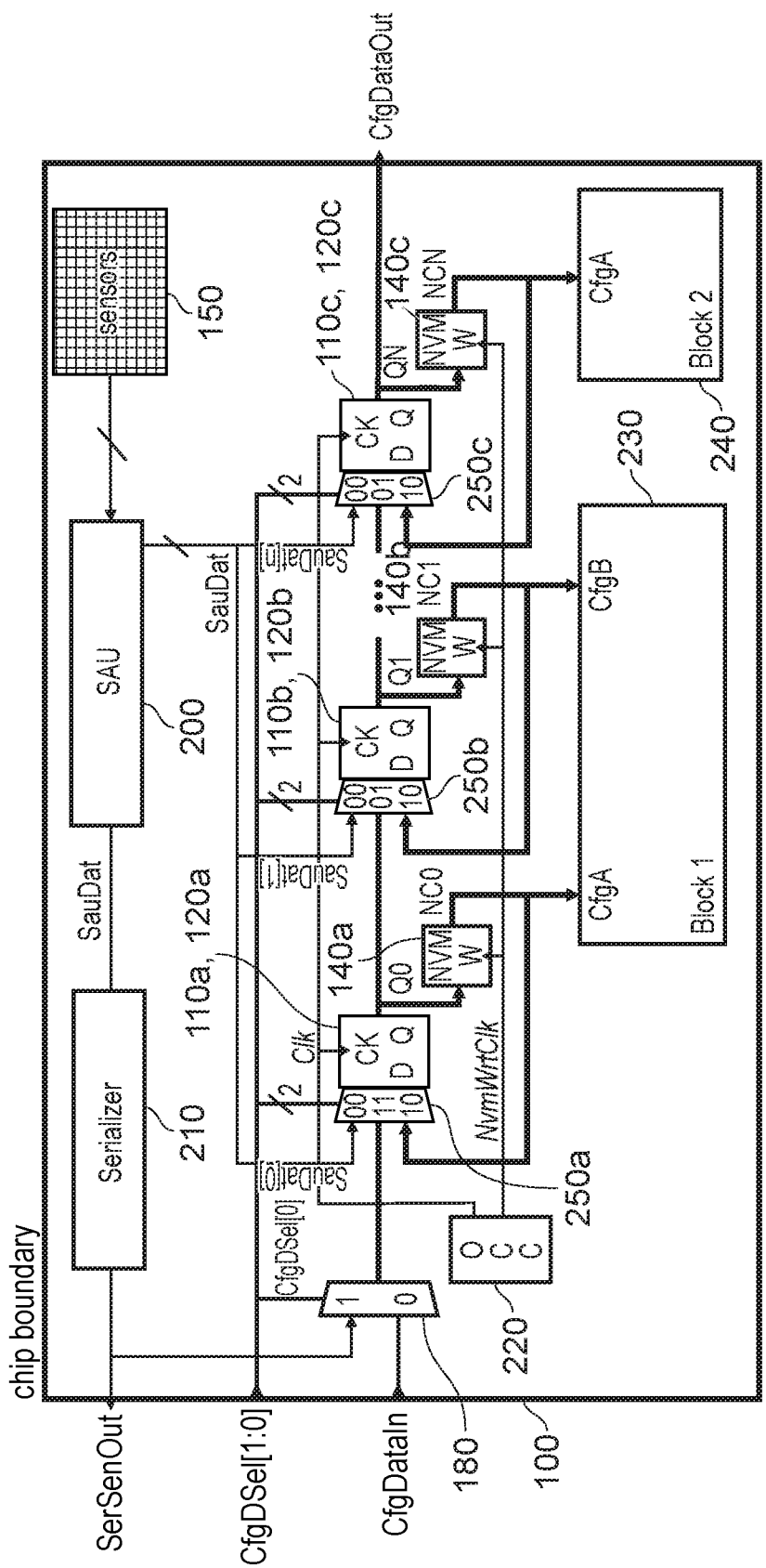
FIG. 2 shows components of the system-on-chip in more detail in accordance with some examples.

FIG. 2 shows components of the system-on-chip 100 in more detail. In this example, the system-on-chip 100 includes a sensor array 150. Readings from the sensor array 150 are sent to a sensor analysis unit (SAU) 200, which analyses the sensor data and makes decisions based on the sensor data values. This sensor data, which could be temperature readings for instance, is used by on-chip configuration blocks 230, 240. For instance, the on-chip configuration blocks 230, 240 could change the behaviour (e.g. processing speed) of the system-on-chip 100 in dependence on the current temperature in order to run efficiently. The sensor data (SauDat) can be serialized by a serializer 210, which turns the data into a serial stream of data (SerSenOut), suitable for being sent off-chip. As an alternative, the serialized data can be sent to the 2:1 multiplexer 180 previously described. The SAU 200 can also send the data (SauDat) in parallel to a set of flops 110a, 120a; 110b, 120b; 110c, 120c, which collectively act as the read circuitry 110 and write circuitry 120 for communication with the non-volatile storage circuitry 140, which in this example is made up from a set of cells 140a, 140b, 140c. Each of the flops 110a, 120a; 110b, 120b; 110c, 120c is set up to output one bit Q0, Q1, QN of the data to the non-volatile storage cells 140a, 140b, 140c in response to a clock signal (Clk). In this example, via the SAU 200, the data (SauDat) is loaded into the flops 110a, 120a; 110b, 120b; 110c, 120c in parallel and in response to a second clock signal (NvmWrtClk), the data Q0, Q1, QN is written to the non-volatile storage circuitry 140 in parallel.

In response to the second clock signal (NvmWrtClk), data NC0, NC1, NCN can be read from the non-volatile storage circuitry 140, thereby providing configuration input data to on-chip blocks 230, 240 or provided back to the flops 110a, 120a; 110b, 120b; 110c, 120c for outputting (CfgDataOut). The two clock signals are generated by OCC (On-Chip Clock) circuitry 220.

In this circuitry, a more complex selection signal is provided to control the 2:1 multiplexer 180. The selection signal is made up from two bits. The first bit (0) is used to control the 2:1 multiplexer in order to select between a CfgDataIn signal and a SauDat signal. In addition, both bits are used to control 3:1 multiplexers 250a, 250b, 250c provided at each of the flops 110a, 120a; 110b, 120b; 110c, 120c. The 3:1 multiplexers 250a, 250b, 250c allow a selection of input signal to the flops 110a, 120a; 110b, 120b; 110c, 120c as follows:

| CfgDSel[1] | CfgDSel[0] | Data source |
|---|---|---|
| 0 | 0 | Parallel load from SAU |
| 0 | 1 | (unused) |
| 1 | 0 | Parallel load from NVM |
| 1 | 1 | Serial load |

The above diagram therefore illustrates the manner in which on-chip non-volatile storage circuitry 140 can be used to locally read and write configuration data, which is used by the on-chip blocks 230, 240. The data can be read and written in parallel and therefore does not require a serial shifter. In this way, configuration data that can be used to control the behaviour of part of the system-on-chip 100 can be read and written quickly, and at low power consumption.

One way in which the apparatus of FIG. 2 could be used is in respect of machine learning (described in more detail below). The SAU can use live data from the sensors. Meanwhile, off-chip training could use live data from a previous window of time, which has been transmitted via the CfgDataOut port. Training weights, determine from off-chip training, can then be shifted back into the chip via the CfgDataIn port and stored in the non-volatile storage circuitry 140, where they provide weights for performing an operation on operational blocks 230, 240.

Figure 3:
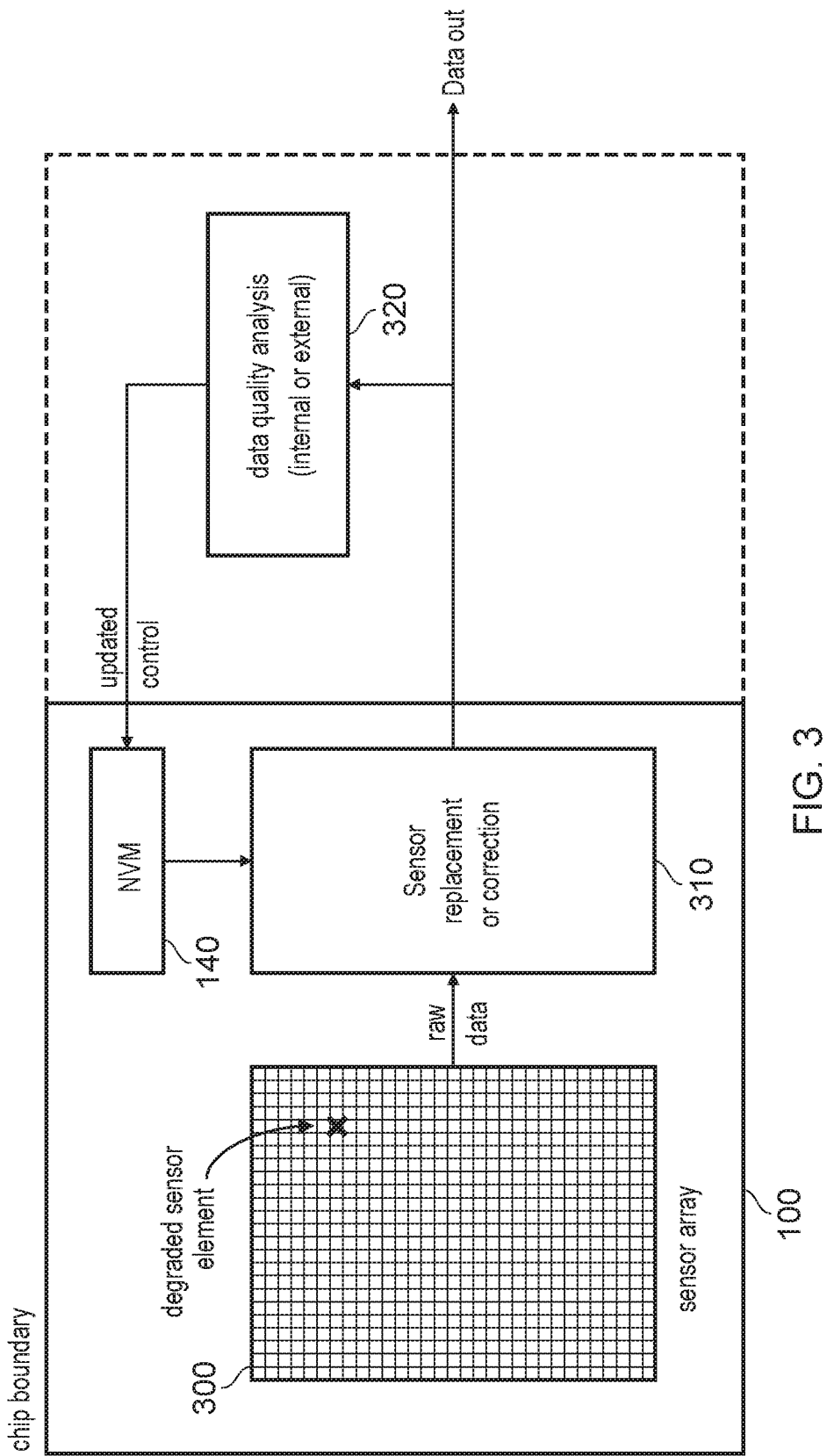
FIG. 3 illustrates an example in which the quality of sensor data can be improved in the field in accordance with some examples.

FIG. 3 illustrates an example in which the quality of sensor data can be improved in the field. In particular, the system is able to detect the degraded performance of a sensor and apply a persistent corrective action. Since the correcting action is stored persistently, it can be accessed quickly and is not lost even if the system-on-chip 100 is powered down.

In these embodiments, the functional circuitry 150 includes a sensor array 300. The sensor array 300 provides raw sensor data to the sensor replacement/correction circuitry 310. This in turn provides data to a data quality analysis circuit 320, which may be outside the system-on-chip 100. This circuitry could, for instance, be a CPU of a general purpose computer. The data quality analysis circuitry 320 analyses the sensor data and, in this instance, notes that data from one of the sensor elements (shown in FIG. 3) is nonsensical due to the sensor element having degraded. Such a conclusion may not be identified immediately, but might instead be identified as a consequence of several items of raw data output by the sensor replacement/correction circuitry 310. The data quality analysis circuitry 320 sends revised control information, which is stored in the non-volatile storage 140. This in turn is used by the sensor replacement/correction circuitry 310. In the future, when raw data is received from the sensor array 300 by the sensor replacement/correction circuitry 310, the degraded sensor element is compensated, corrected, or discarded as appropriate. Erroneous data from the degraded sensor element is therefore compensated for.

Note that in these embodiments, the correction can be carried out in the field, provided that data quality analysis circuitry 320 is available. Having analysed the raw data and provided a correction, the correction can be stored persistently in the non-volatile storage circuitry 140. In this way, the knowledge of the defective/degraded sensor element is not lost and corrections can be made, even if the system-on-chip 100 is powered down. Since the data is stored in the local (e.g. on-chip) non-volatile storage circuitry 140, it can be quickly accessed without having to be loaded in off-chip from a serial shift register.

Figure 4:
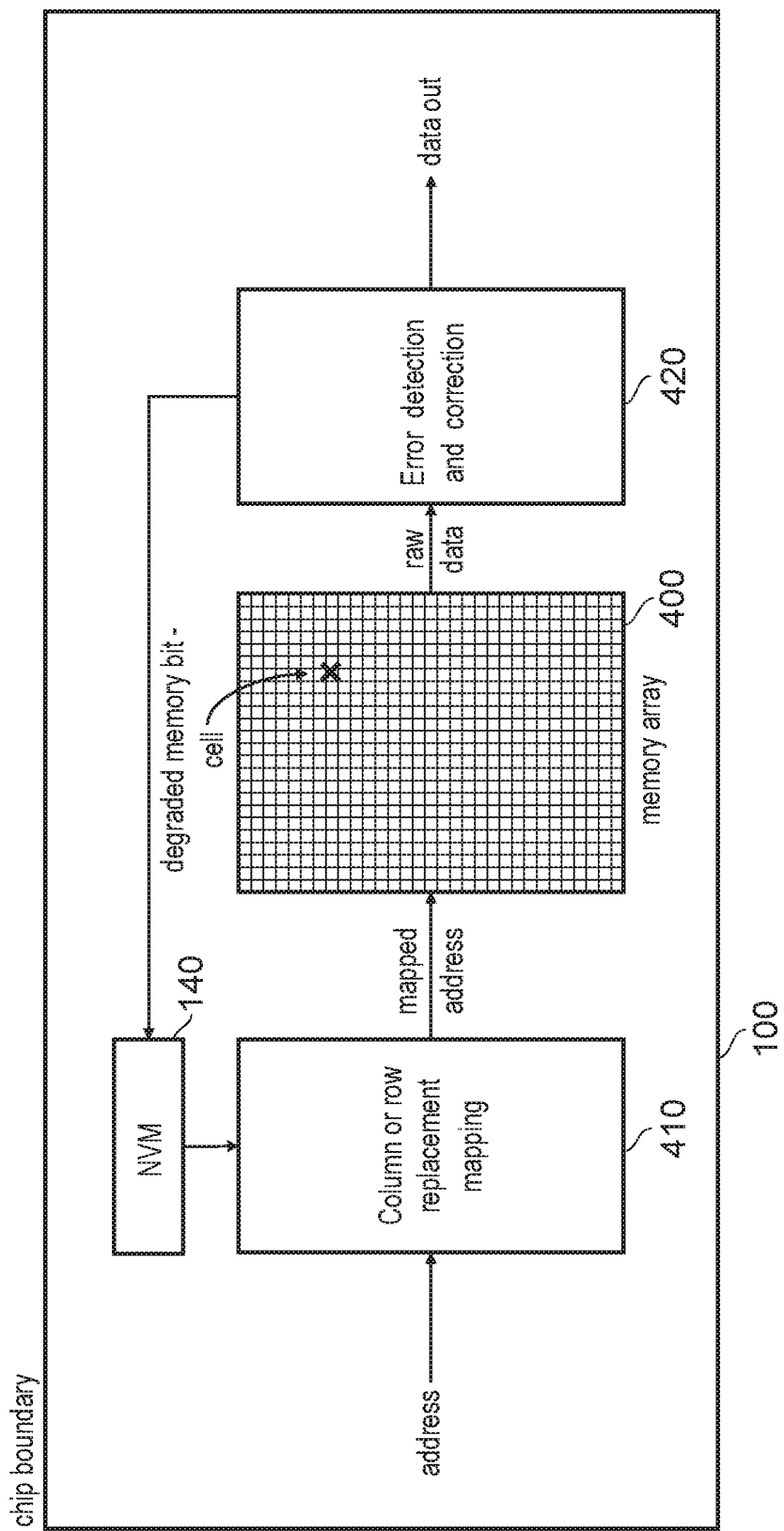
FIG. 4 shows another example in which the configuration parameters can be used to perform repair in the field in accordance with some examples.

FIG. 4 shows another example in which the configuration parameters can be used to perform repair in the field. In this example a memory array 500 is provided. The memory array contains a number of bit cells arranged in rows and columns. At least some redundant bit cells, rows, and/or columns are also provided. A corrective action can be taken in order to respond or 'repair' a degraded memory cell. This is achieved by providing a redundant section of the memory array to use for a particular row/column, thereby avoiding the use of the degraded cell. The information regarding the degraded cell and its correction can be stored as part of the configuration parameters. Since these are stored persistently, this information can be accessed even after the system-on-chip 100 has been powered down thereby avoiding the degraded cell from being inadvertently used when the system-on-chip 100 is powered back up. Furthermore, since the parameters are stored on the non-volatile storage circuitry 140, they can be accessed quickly.

In these embodiments, the functional circuitry 150 includes the memory array 400. In this example, a memory address is received by the column/row replacement mapping circuitry 410. Here, the column/row replacement mapping circuitry 410 determines the row/column to be accessed for the requested memory address using a mapping. The mapped address or location is then used to access the memory array 400 and the raw data stored at that location is passed to the error detection/correction circuitry 420. Here, the error correction/detection circuitry 420 may detect that the retrieved data has an error. In the case of memory, this can be achieved using ECC memory in which a checksum can be used in order to detect and/or correct one or more errors. If an error is detected, then it may be concluded that one or more cells in the column or row has degraded. Consequently, a revised mapping is stored in the non-volatile memory 140 to refer to a different column/row of the memory array 400, with the data being retrieved from the old column/row if possible. In this way, in the future, the column/row containing the potentially degraded cell is avoided.

It will be appreciated that although the above technique has been directed towards memory, it could also be applied to, for instance, connections between dies or to interconnections between processor cores for instance.

Figure 5:
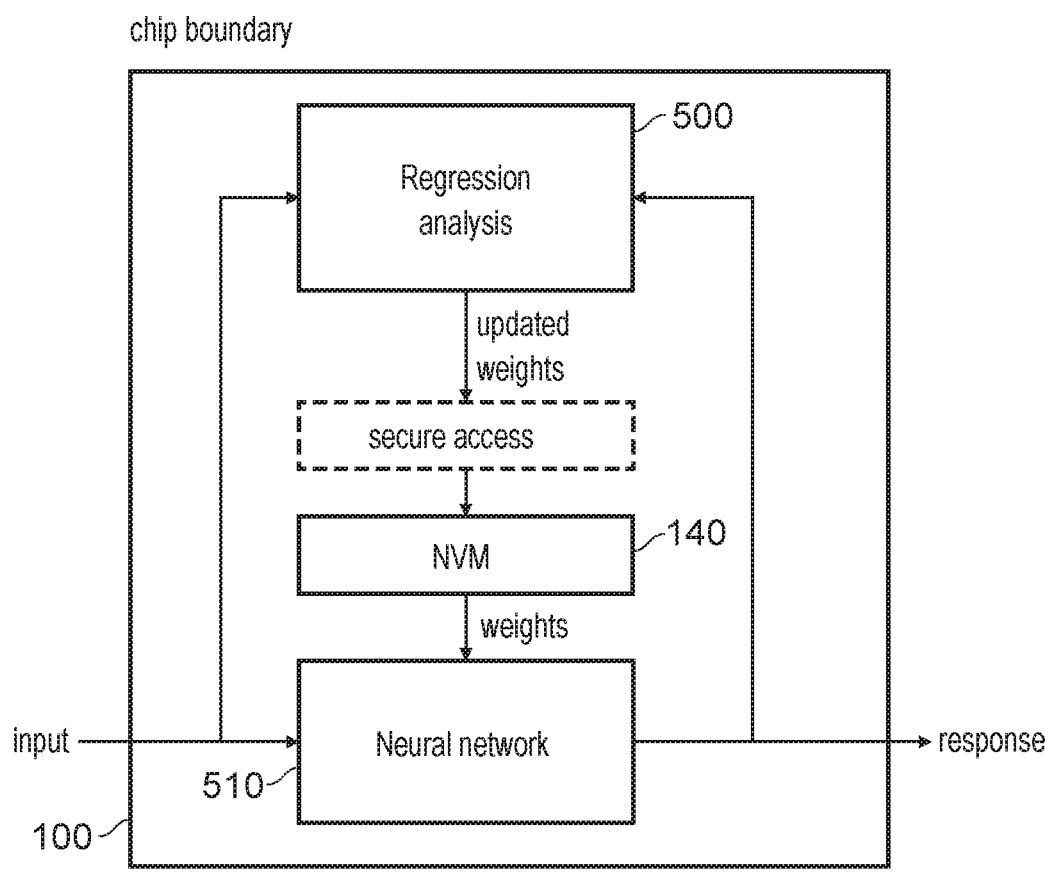
FIG. 5 illustrates an example in which the configuration parameters can contribute towards machine learning to provide an adaptive machine learning system in accordance with some examples.

FIG. 5 illustrates an example in which the configuration parameters can contribute towards machine learning to provide an adaptive machine learning system. The system is able to persistently store weights that are used as part of a neural network. By storing these weights persistently in non-volatile storage circuitry, they can be accessed quickly and are not lost even if the system-on-chip 100 is powered down.

In these embodiments, the functional circuitry 150 includes a neural network 510. Machine learning techniques use a set of training data in order to adjust one or more weights. For instance, where machine learning is used to analyse photographs in order to detect the presence of people, the training data may include a set of photographs and detail of where people are located (if at all) within those photographs. The training data is used to develop a set of weights (e.g. parameter coefficients) that are used in order to analyse the photographs. Regression analysis can be used to determine the quality of the analysis performed when using those weights. Over time, and given enough data, the weights are tuned so as to perform detection with higher and higher accuracy. In this embodiment, the regression analysis is performed by the regression analysis circuitry 500 and the neural network 510 performs the analysis using the weights. The weights are stored in the non-volatile storage circuitry 140. Since the non-volatile storage circuitry 140 is stored as part of the system-on-chip 100, it is difficult for external circuitry to access the weights—either to read them or to modify them without permission. The analysis process is therefore kept secure. Furthermore, by keeping the weights on the non-volatile storage circuitry 140, the weights can be accessed quickly even after having been powered down.

Having determined the set of weights, it is possible for the weights to be improved over time by using live data. In particular, even once the weights have been established, input data that is analysed by the neural network 510 can be kept and used for further training. In practice, this may require additional human input in order to provide a 'correct' answer for the machine learning process to adapt. In this case, the configuration parameters including the weights can be loaded, modified, and written back to the non-volatile storage circuitry 140.

Note that in some embodiments, the machine learning process may occur partly or entirely off-chip, as has already been explained with respect to FIG. 2. For instance, an initial training process could initially be performed off-chip, with the system-on-chip using live data to further improve the weights.

Depending on computing resources available, including energy for battery-operated devices, it may be advantageous to do training off-chip and inference (e.g., keyword detection) on-chip. Different training algorithms (or the same algorithm with a different training data set) can be used for each of several systems-on-chips forming a collection of systems-on-chips. This can be used to achieve a better overall (system-wide) accuracy such as when some of the systems acquire noisy input data.

Figure 6:
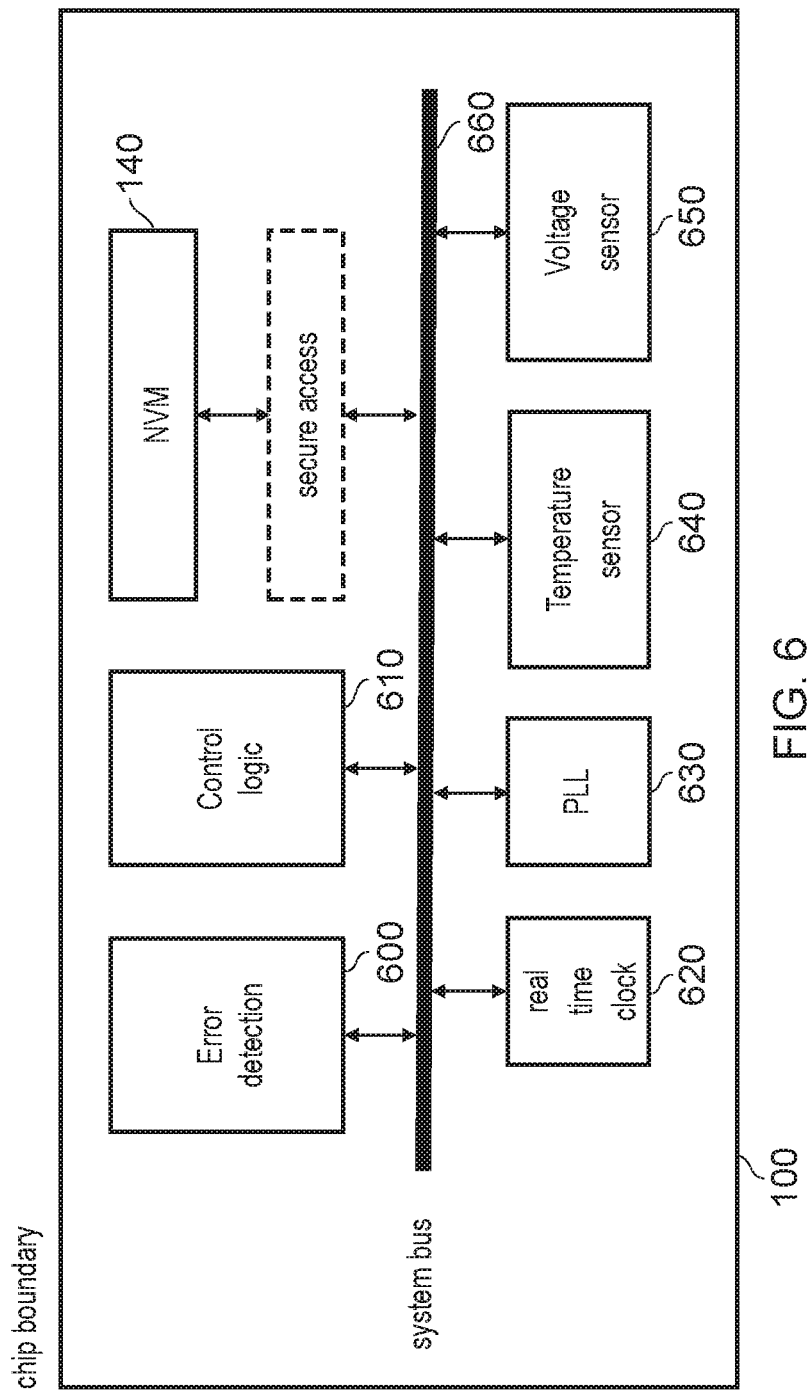
FIG. 6 shows an example in which Reliability, Availability, and Serviceability (RAS) logging may be used in accordance with some examples.

FIG. 6 shows an example in which Reliability, Availability, and Serviceability (RAS) logging may be used. Such information can be used for providing data appropriate to service, warranty, and aging protection. This information is kept locally on the non-volatile storage circuitry 140 and therefore can be held securely with limited risk of tampering. The data is, furthermore, persistent and so is not lost after the system-on-chip 100 is powered down.

In these embodiments, the system-on-chip 100 may include a number of components such as control logic 610, a real time clock 620, a phase-locked loop (PLL), a temperature sensor 640, and a voltage sensor 650, each of which is connected to an error detection circuit 600 and control logic 610 (and the non-volatile storage circuitry 140) via a system bus 660. Each of the components can be used to provide diagnostic data in the event of an error detected by error detection circuitry 600. In this instance, control logic 610 can be used to acquire data from the relevant components as well as details as to what the system-on-chip 100 was doing at the time that the error occurred in order to provide the RAS data. The RAS data can then be stored in the non-volatile storage circuitry 140, which is securely accessed due to its presence on the system-on-chip 100 rather than being external.

The RAS data could include, for instance, error rates over time and across power fail/reset events. This in turn can be used to track the number and degree of errors that are occurring. By virtue of the non-volatile storage circuitry 140 being provided locally, a large amount of data can be stored and accessed quickly. In some embodiments, multiple redundant copies of the RAS data can be stored, and voting logic can be used to correct errors that may arise. The RAS data can also be used to track failing components. Where the RAS data indicates that a particular module has degraded past the point of usability, use of that module may be inhibited by the control logic 610.

In this example, the configuration parameters could include the parameters with which the RAS data is gathered, such as the frequency and type of querying that is performed and on which modules. However, the configuration parameters could include the RAS data itself, which may be retrieved and updated over time. For instance, where the RAS data includes the number of errors that have occurred, the RAS data must be retrieved and updated as errors occur over time.

A further way in which the RAS data can be used is as a record of a history of operating conditions such as the amount of time at a particular clock frequency, voltage and temperature for one or more components. By analysing the history, an administrator or user of the system can be warned that a component is due for service or replacement (e.g. since the component has operated in a particular way such as a particular temperature for longer than is recommended by the manufacturer). In this way, a record of the device's history can be carried around with it—protected from being accessed/modified by third parties.

Figure 7:
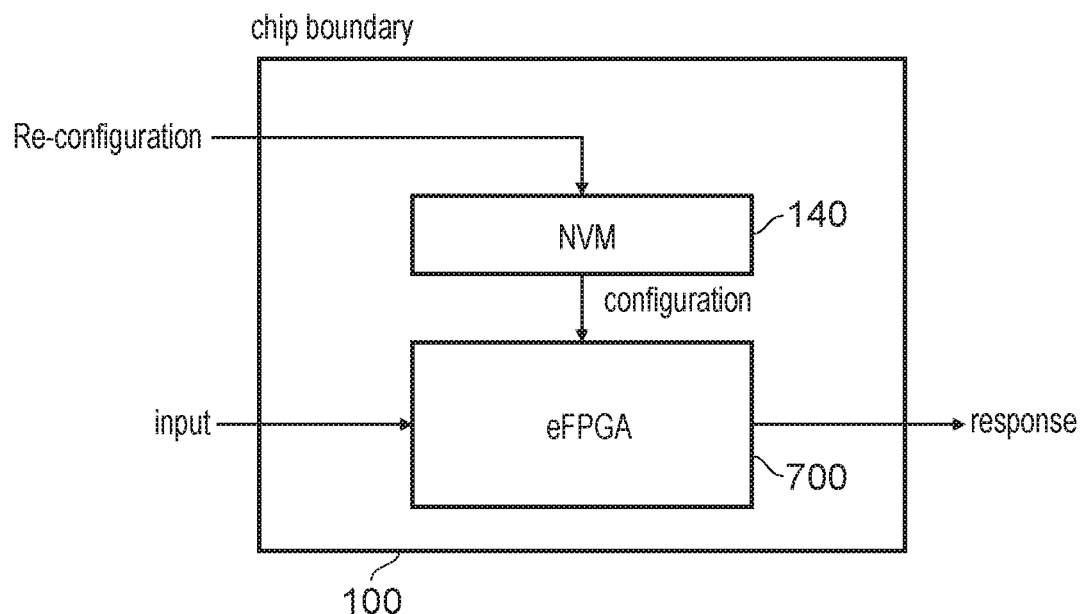
FIG. 7 shows an example in which the functional circuitry includes an eFPGA in accordance with some examples.

FIG. 7 shows an example in which the functional circuitry 150 includes an eFPGA (embedded Field Programmable Gate Array) 700. The eFPGA 700 is a component that can be reprogrammed in the field to perform a particular task. The eFPGA 700 thus receives an input and, by performing a function on that input, provides a response.

In this example, the configuration of the eFPGA 700 is stored in the non-volatile storage circuitry 140. In this way, the eFPGA 700 can be reprogrammed by providing a re-configuration (e.g. code) to the non-volatile storage circuitry 140, which in turn provides the configuration to the eFPGA 700. With the configuration being stored in the non-volatile storage circuitry 140, the configuration can be securely accessed in the future in order for that configuration to be adjusted as necessary. Furthermore, the storage of the configuration persists, even across the system-on-chip 100 being powered down.

Figure 8:
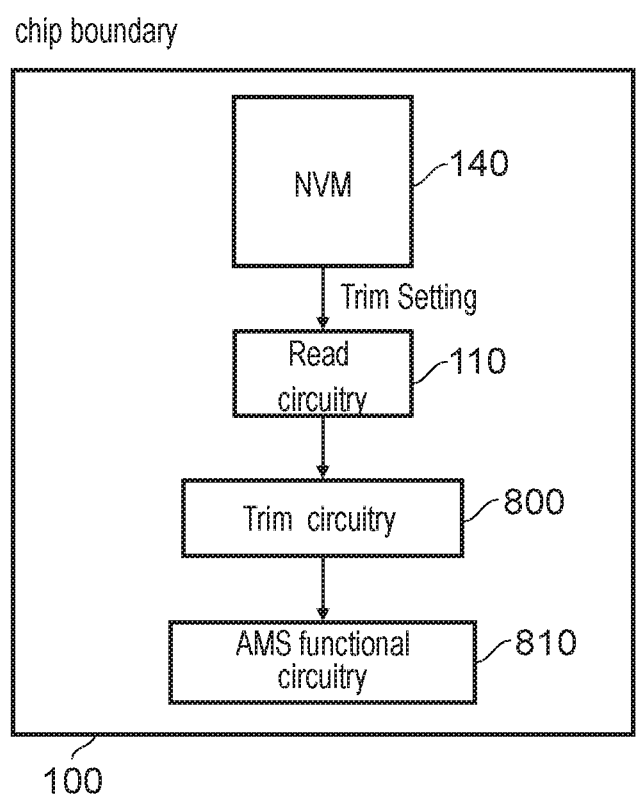
FIG. 8 illustrates how the present technique may be used for the storage and retrieval of trim settings in accordance with some examples.

FIG. 8 illustrates how the present technique may be used for the storage and retrieval of trim settings. Trim settings are settings that can be used to fine-tune the operation of a system. These can take a variety of different forms, including power/voltage scaling, bias currents or gain settings of transistors (e.g. to account for process, voltage, and temperature variation), edge margin adjustment settings for an array, resistance configuration, band gap reference voltages, OSC frequency, etc.

In these examples, the functional circuitry 150 includes AMS (analog/mixed-signal) circuitry 810. These require trim settings to account for process, voltage, and temperature as discussed. The trim settings are set by trim circuitry 800. These are, in turn, stored as the configuration parameters in the non-volatile storage circuitry 140, which accesses the parameters using read circuitry 110. Although not shown in FIG. 7, the trim settings can be adjusted over time, and stored back into the non-volatile storage circuitry 140. Since the non-volatile storage circuitry 140 is local, the trim settings can be accessed quickly and securely and can be persisted across resets of the system-on-chip 100.

Figure 9:
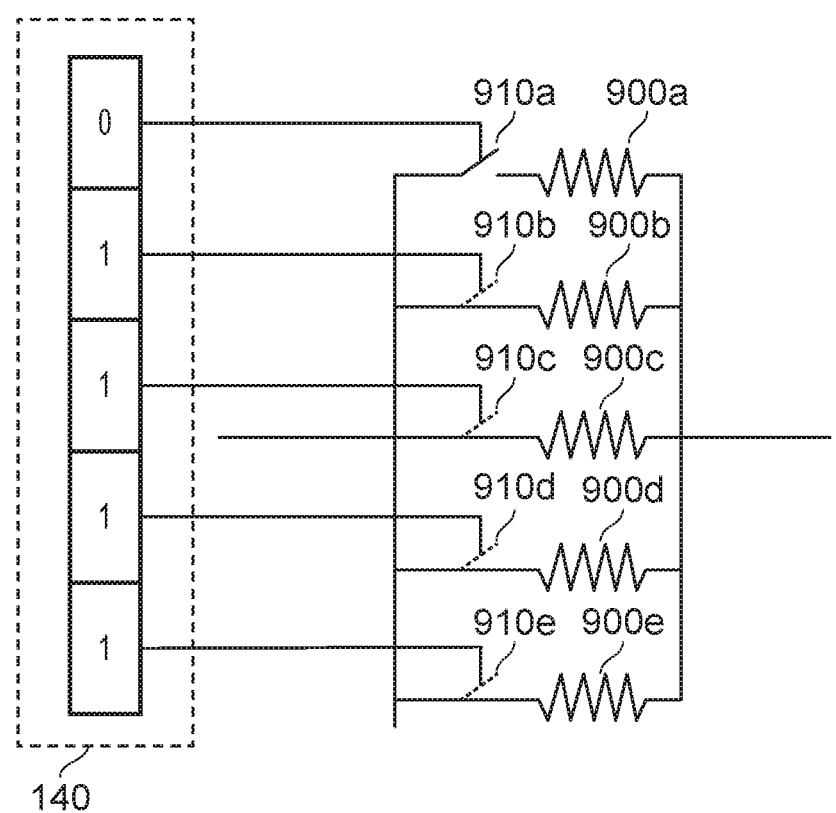
FIG. 9 shows an example of how the trim settings can be used to affect an applied resistance in accordance with some examples.

FIG. 9 shows an example of how the trim settings can be used to affect an applied resistance. In FIG. 9, the non-volatile memory contains a set of bits (01111). These bits are used to control switches 910a, 910b, 910c, 910d, 910e, each attached to a corresponding resistor 900a, 900b, 900c, 900d, 900e, with the resistors 900a, 900b, 900c, 900d, 900e being provided in parallel with each other. Each of the bits (01111) corresponds with one of the switches. When the bit corresponding to a switch is a '0' the switch is opened and so the corresponding resistor is not connected. When the bit is a '1', the switch is closed and the corresponding resistor is connected. In this way, the set of bits can be used to provide a configurable resistance by controlling the set of resistors that are connected in parallel. For example, if each of the five resistors is 10 ohms, then the set of five resistors connected in parallel (e.g. via the series of bits 11111) would be $(1/10+1/10+1/10+1/10+1/10)^{-1}=2$ ohms. With one of the resistors removed (e.g. via the bits 01111), the overall resistance provided would be $(1/10+1/10+1/10+1/10)^{-1}=2.5$ ohms. Such a resistance could be used, for instance, the control behaviour of an analog-to-digital converter (ADC).

Figure 10:
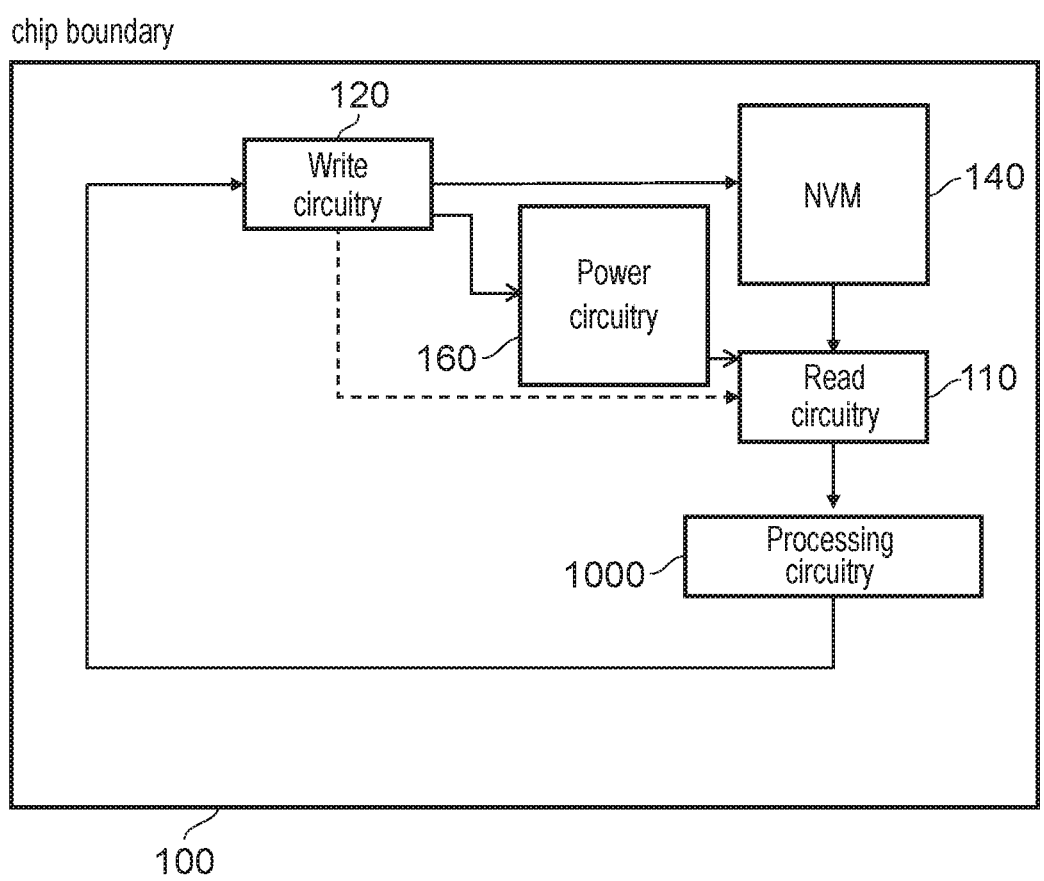
FIG. 10 illustrates an example in which the functional circuitry includes a processor in accordance with some examples.

FIG. 10 illustrates an example in which the functional circuitry 150 includes a processor 1000. Power circuitry 160 is also provided, which is able to power down the system-on-chip 100 in order to cause it to switch between an active mode and a low power mode in which power consumption and processing capability of the processing circuitry is reduced. When the system-on-chip 100 is to enter a low power mode of operation, the state of the processing circuitry (which makes up the configuration parameters) is saved by the write circuitry 120 to the non-volatile storage circuitry 140. The power circuitry 160 then deactivates the system-on-chip 100. When the system-on-chip is to be powered back up to the active state, the power circuitry 160 signals the read circuitry 110 to read the state back from the non-volatile storage circuitry 140 and to restore the state back to the processing circuitry 1000 so that it can resume processing.

In view of the local presence of the non-volatile storage circuitry 140, it is possible to power-cycle the system-on-chip more aggressively. In particular, the data can be saved and restored more quickly and at lower cost than if the non-volatile storage circuitry were provided off-chip. Furthermore, the power consumption of the non-volatile storage circuitry 140 may be significantly reduced as compared to an off-chip non-volatile storage circuit. Consequently, the system-on-chip 100 is able to take advantage of shorter bursts of inactivity in order to save power consumption, thereby leading to an overall improved efficiency device.

Figure 11:
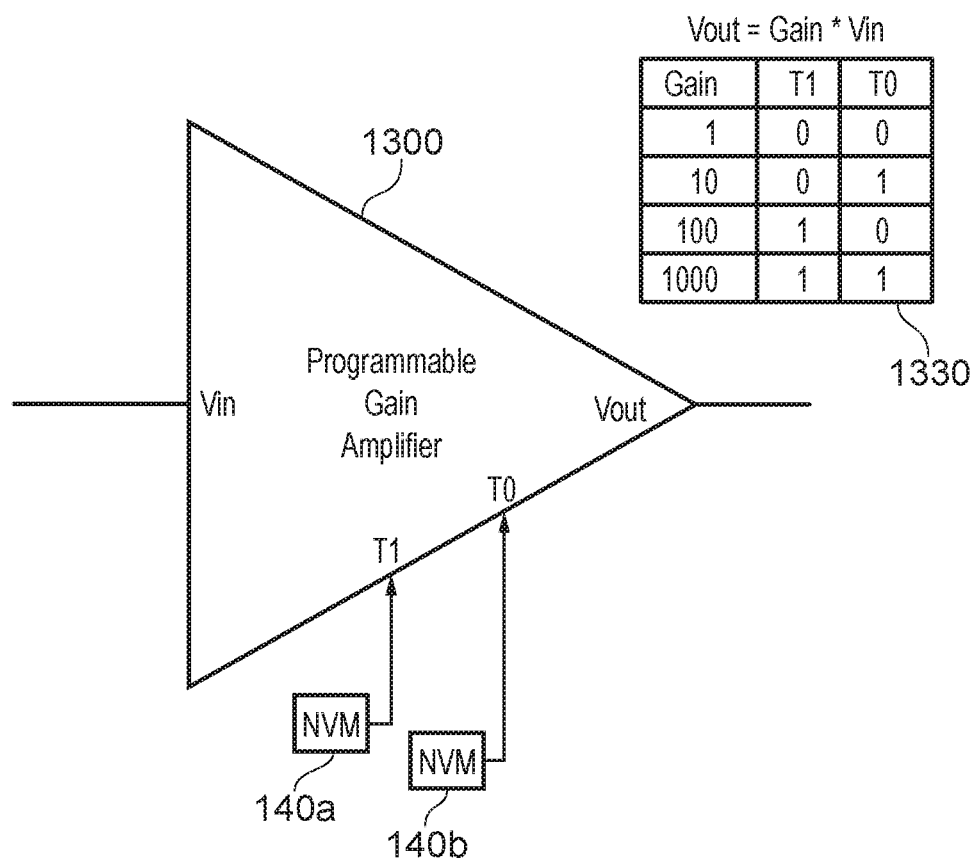
FIG. 11 schematically illustrates a programmable gain amplifier in accordance with some examples.

FIG. 11 shows a programmable gain amplifier 1300. Such an amplifier can be constructed from a number of transistors, resistors, and other passive components. The gain of the amplifier can be adjusted using configuration data stored in the non-volatile storage circuitry 140. For instance, FIG. 11 shows a pair of bits T1, T0.

These bits collectively specify a gain value, as shown in the table 1330 in FIG. 11. In this example, if the parameter p is expressed as the bits {T1, T0} expressed as a decimal number then the gain can be expressed as $10^p$. The gain is then multiplied by an input voltage $V_{in}$ to give an output voltage $V_{out}$.

Figure 12:
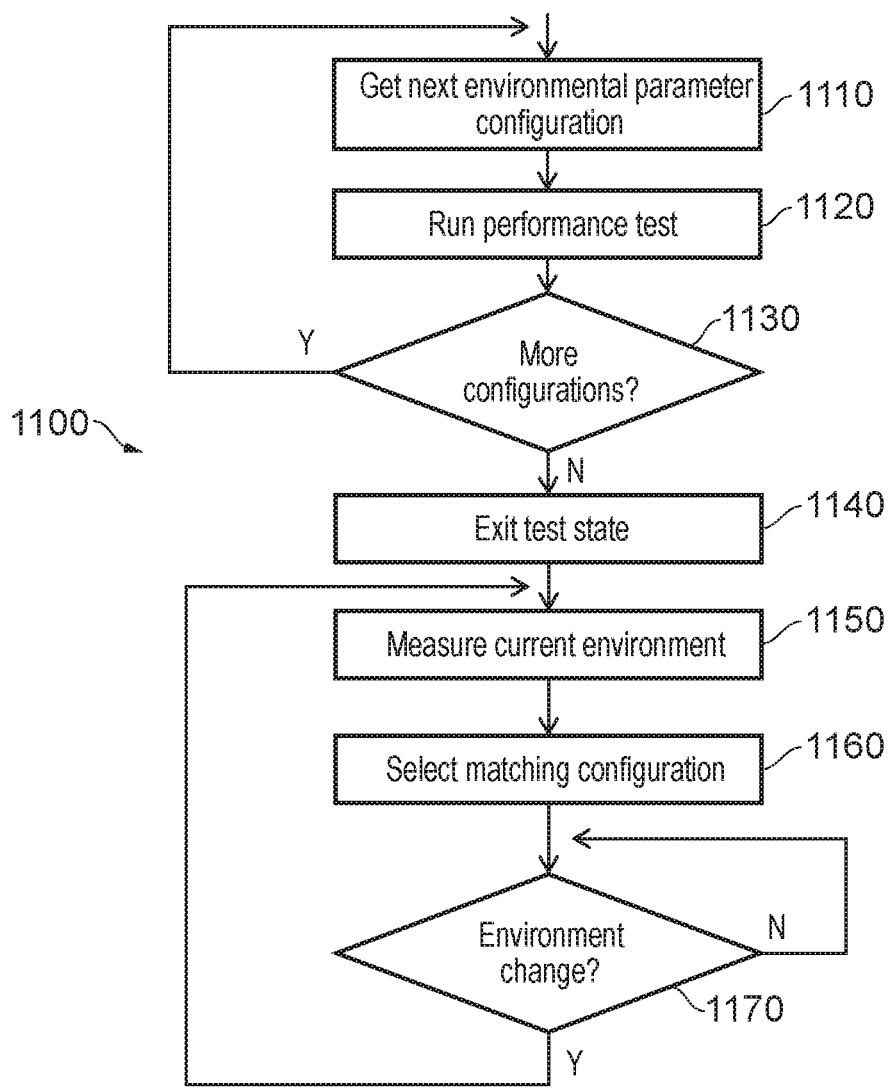
FIG. 12 illustrates a flow chart that shows a method of running performance tests for different environmental parameters in accordance with some examples.

FIG. 12 illustrates a flow chart 1100 that shows a method of running performance tests for different environmental parameters. For instance, the environmental parameters could include a voltage and frequency of a clock signal of a processor, together with an operating temperature and a current workload of the processor. Using these, a performance measurement can be made so that an appropriate frequency/voltage combination can be selected for a given operating temperature and workload of the processor. Since such parameters may differ as a consequence of manufacturing, such a test may be performed after each system-on-chip is manufactured as well as at particular intervals (such as every six months or every number of clock cycles). In this way, the effectiveness of the processor over time can be established. The configuration parameters here may include the combinations of environmental parameters together with their performance measurement.

At a step 1110, which may take place whenever the test is to occur, the next environmental parameter configuration is obtained. At a step 1120, a performance test is performed using those parameters and the result is recorded. At a step 1130, it is determined whether more configurations exist. If so, then the process returns to step 1110. Otherwise, the process proceeds to step 1140. At step 1140, the testing state is exited. At a step 1150, the current environment is measured. Then, at step 1160, a search is made for a matching configuration. In particular, the best performing combination of voltage/frequency for the current temperature/workload is determined.

At step 1170, the process waits until a change in environment (e.g. temperature/workload) occurs. When this occurs, the process returns to step 1150 to select a new frequency/voltage combination to use. The testing process may restart after a period of time has elapsed or in response to another limit being reached such as a number of processor cycles.

In this way, suitable operating parameters can be persistently stored even if the system-on-chip 100 loses power. The operating parameters are calculated so as to be specific to the actual system-on-chip 100 being used. Furthermore, the parameters can be accessed quickly (due to being local) and thus, changes in the operating parameters can be performed quickly.

Figure 13:
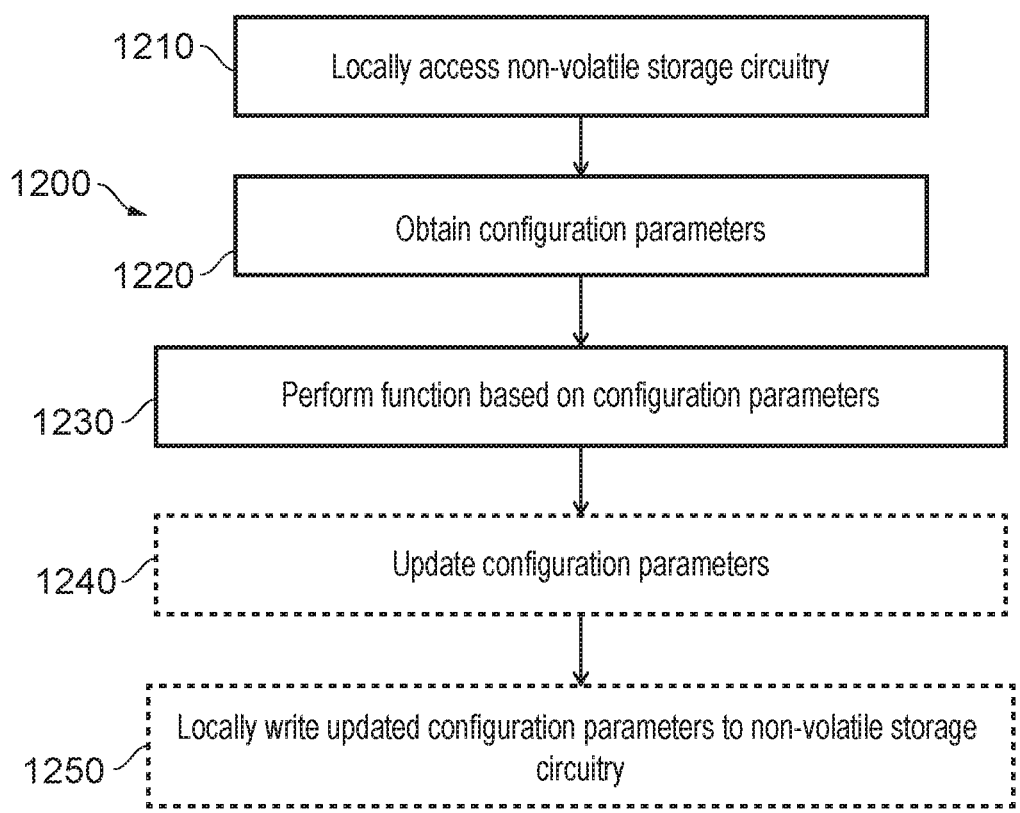
FIG. 13 illustrates a method of data processing in accordance with some examples.

FIG. 13 illustrates a method of data processing in accordance with some examples. In particular, FIG. 13 illustrates the method in the form of a flow chart 1200. At a step 1210, the non-volatile storage circuitry is locally accessed. At a step 1220, the configuration parameters are obtained. At a step 1230, a function is performed based (e.g. using) on the configuration parameters. At a step 1240, the configuration parameters are updated. This may not necessitate a change to the parameters, but rather there is a potential for the parameters to be changed. Then, at a step 1250, the updated configuration parameters are locally written back to the non-volatile storage circuitry. Again, if the configuration parameters are unchanged, then the write stage may not take place.

In the present application, the words "configured to . . . " are used to mean that an element of an apparatus has a configuration able to carry out the defined operation. In this context, a "configuration" means an arrangement or manner of interconnection of hardware or software. For example, the apparatus may have dedicated hardware which provides the defined operation, or a processor or other processing device may be programmed to perform the function. "Configured to" does not imply that the apparatus element needs to be changed in any way in order to provide the defined operation.

Although illustrative embodiments of the invention have been described in detail herein with reference to the accompanying drawings, it is to be understood that the invention is not limited to those precise embodiments, and that various changes, additions and modifications can be effected therein by one skilled in the art without departing from the scope and spirit of the invention as defined by the appended claims. For example, various combinations of the features of the dependent claims could be made with the features of the independent claims without departing from the scope of the present invention.

We claim:

1. A system-on-chip, comprising:
functional circuitry to perform a function;
control circuitry to control the function based one or more configuration parameters;
non-volatile storage circuitry comprising a plurality of non-volatile storage cells each being adapted to write at least a bit of the one or more configuration parameters in a rewritable, persistent manner a plurality of times;
read circuitry to locally access the non-volatile storage circuitry, obtain the one or more configuration parameters from the non-volatile storage circuitry and provide the one or more configuration parameters to the control circuitry; and
write circuitry to obtain the one or more configuration parameters and provide the one or more configuration parameters to the non-volatile storage circuitry by locally accessing the non-volatile storage circuitry, wherein
the functional circuitry has a plurality of operating modes, each of the operating modes corresponding with a voltage and a frequency with which the functional circuitry can be made to operate;
the one or more configuration parameters indicate which of the operating modes should be used based on at least one of: temperature, workload, and current operation to be performed by the functional circuitry;
the functional circuitry is adapted, in response to an event, to run a performance test to determine which of the operating modes should be used for each of the at least one of temperature, workload, and current operation to be performed by the functional circuitry; and
the write circuitry is adapted to write results of the performance test as the one or more configuration parameters.

2. The system-on-chip according to claim 1, comprising:
power circuitry to provide at least one voltage domain to the functional circuitry and the non-volatile storage circuitry.

3. The system-on-chip according to claim 1, wherein the voltage domain has a voltage of 1.8 volts or less.

4. The system-on-chip according to claim 1, wherein the non-volatile storage circuitry is CMOS compatible.

5. The system-on-chip according to claim 1, wherein the functional circuitry is an analog/mixed-signal circuit; and
the one or more configuration parameters comprise one or more trim settings.

6. The system-on-chip according to claim 5, wherein the functional circuitry comprises a plurality of resistors, each of the resistors being coupled with a switch in series and each resistor, switch pair being arranged in parallel; and
the one or more configuration parameters control which of the switches is open or closed.

7. The system-on-chip according to claim 5, wherein the functional circuitry comprises one or more transistors; and
the one or more configuration parameters control a gain of the one or more transistors.

8. The system-on-chip according to claim 1, wherein the event is the expiration of a period of time.

9. The system-on-chip according to claim 1, wherein the plurality of modes comprises a low power mode of operation;
the one or more configuration parameters comprise a current state of the functional circuitry; and
the functional circuitry is adapted to use the write circuitry when entering the low power mode of operation and to use the read circuitry when exiting the low power mode of operation.

10. The system-on-chip according to claim 1, wherein the one or more configuration parameters comprise a current state of the functional circuitry; and
the current state of the functional circuitry comprises at least one of: temperature, workload, and clock frequency of the functional circuitry.

11. A system-on-chip, comprising:
functional circuitry to perform a function;
control circuitry to control the function based one or more configuration parameters;
non-volatile storage circuitry comprising a plurality of non-volatile storage cells each being adapted to write at least a bit of the one or more configuration parameters in a rewritable, persistent manner a plurality of times;
read circuitry to locally access the non-volatile storage circuitry, obtain the one or more configuration parameters from the non-volatile storage circuitry and provide the one or more configuration parameters to the control circuitry; and
write circuitry to obtain the one or more configuration parameters and provide the one or more configuration parameters to the non-volatile storage circuitry by locally accessing the non-volatile storage circuitry, wherein the functional circuitry comprises error detection circuitry to detect errors during the function and to write data relating to at least some of the errors; and the one or more configuration parameters comprise control of a type and a frequency of those of the errors that form the at least some of the errors.

12. The system-on-chip according to claim 11, wherein the functional circuitry comprises Error Correcting Code circuitry comprising a plurality of memory cells.

13. The system-on-chip according to claim 12, wherein in response to the error detection circuitry detecting an error with one of the memory cells in the Error Correcting Code circuitry, the one or more configuration parameters are adapted to indicate the one of the memory cells as a faulty memory cell; and the control circuitry is adapted to inhibit use of either:
 the faulty memory cell, or
 a plurality of the memory cells comprising the faulty memory cell.

14. The system-on-chip according to claim 11, wherein the functional circuitry comprises an array of sensors;

in response to the error detecting circuitry detecting an error with one of the sensors, the one or more configuration parameters are adapted to indicate the one of the sensors as a faulty sensor; and the control circuitry is adapted to inhibit use of either:
 the faulty sensor, or
 a plurality of sensors comprising the faulty sensor.

15. The system-on-chip according to claim 1, wherein the functional circuitry comprises processing circuitry adapted to perform a machine learning process;

the one or more configuration parameters comprise a set of weights; and the processing circuitry is adapted to devise the weights based on training data and to cause the write circuitry to write the weights to the non-volatile storage circuitry.

16. The system-on-chip according to claim 15, wherein the processing circuitry is adapted to perform the machine learning process on the weights using live data to produce a set of updated weights; and the processing circuitry is adapted to cause the write circuitry to write the updated weights to the non-volatile storage circuitry.

17. A data processing method, comprising:
performing a function using functional circuitry;
controlling the function based one or more configuration parameters; and
locally accessing non-volatile storage circuitry comprising a plurality of non-volatile storage cells each being adapted to write at least a bit of the one or more configuration parameters in a rewritable, persistent manner a plurality of times in order to
 obtain the one or more configuration parameters from the non-volatile storage circuitry to be used in the step of controlling, and/or
provide the one or more configuration parameters to the non-volatile storage circuitry to be stored, wherein
the functional circuitry and the non-volatile storage circuitry are part of a same system-on-chip;
the functional circuitry has a plurality of operating modes, each of the operating modes corresponding with a voltage and a frequency with which the functional circuitry can be made to operate;
the one or more configuration parameters indicate which of the operating modes should be used based on at least one of: temperature, workload, and current operation to be performed by the functional circuitry;
the functional circuitry is adapted, in response to an event, to run a performance test to determine which of the operating modes should be used for each of the at least one of temperature, workload, and current operation to be performed by the functional circuitry; and
results of the performance test are written as the one or more configuration parameters.

18. A system-on-chip, comprising:
functional circuitry to perform a function based one or more configuration parameters;
error detection circuitry to detect errors during the function and to generate data relating to the errors;
non-volatile storage circuitry comprising a plurality of non-volatile storage cells each being adapted to write at least a bit of the one or more configuration parameters in a rewritable, persistent manner a plurality of times;
write circuitry to locally access the non-volatile storage circuitry and provide the data to the non-volatile storage circuitry; and
the one or more configuration parameters comprise control of a type and a frequency of those of the errors that form the at least some of the errors.

\* \* \* \* \*